(12) United States Patent
Pascucci

(10) Patent No.: US 6,552,952 B2
(45) Date of Patent: Apr. 22, 2003

(54) COLUMN MULTIPLEXER FOR SEMICONDUCTOR MEMORIES

(75) Inventor: Luigi Pascucci, Milan (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/158,553

(22) Filed: May 30, 2002

(65) Prior Publication Data

US 2002/0196695 A1 Dec. 26, 2002

(30) Foreign Application Priority Data

May 30, 2001 (IT) .................... MI2001A001150

(51) Int. Cl.[7] ................................. G11C 8/00
(52) U.S. Cl. ..................... 365/230.06; 365/189.02; 365/230.02
(58) Field of Search .............. 365/230.06, 189.02, 365/230.02

(56) References Cited

U.S. PATENT DOCUMENTS

| | | | | |
|---|---|---|---|---|
| 4,975,877 A | * | 12/1990 | Bell | 365/189.01 |
| 5,430,685 A | * | 7/1995 | Nakada | 365/230.05 |
| 5,448,518 A | | 9/1995 | Jinbo | 365/185 |
| 5,450,341 A | * | 9/1995 | Sawada et al. | 365/185.24 |
| 5,513,327 A | * | 4/1996 | Farmwald et al. | 710/305 |
| 6,091,667 A | * | 7/2000 | Tanaka et al. | 365/238.5 |
| 6,122,219 A | * | 9/2000 | Zheng et al. | 365/230.06 |
| 6,181,597 B1 | | 1/2001 | Nachumvosky | 365/185 |
| 6,377,504 B1 | * | 4/2002 | Hilbert | 365/230.03 |

FOREIGN PATENT DOCUMENTS

| | | |
|---|---|---|
| EP | 0 791 936 | 8/1997 |
| GB | 2 272 089 | 5/1994 |

OTHER PUBLICATIONS

Abstract on the 1996 International Conference on Solid State Devices and Materials, Yokohama, 1996, pp. 269–271 entitled "A Novel NOR Virtual–Ground Array Architecture for High Density Flash"; XP 000694045.

TSAO et al.: "A 5V–Only 16M Flash Memory Using A Contactless Array of Source–side Injection Cells", 1995 Symposium on VLSI Circuits, Kyoto, Jun. 8–10; pp. 77–78. XP000557809.

* cited by examiner

*Primary Examiner*—Richard Elms
*Assistant Examiner*—Tuan T. Nguyen
(74) *Attorney, Agent, or Firm*—Allen, Dyer, Doppelt, Milbrath & Gilchrist, P.A.; Lisa K. Jorgenson

(57) ABSTRACT

The column multiplexer is for a memory matrix having memory cells arranged in rows and columns. The multiplexer includes input lines for input signals, a plurality of output lines for electrical connection to the columns of the matrix, a selective connection device for selecting, in a first operation mode, at least one output line of the plurality of output lines in such a way as to connect it selectively to the input lines. In the first operation mode, the selective connection device selects a first group of output lines among the plurality of output lines, including at least three first lines.

39 Claims, 8 Drawing Sheets

Legend:
- S → V-BL
- B → V-Bias
- G → GND
- F → Float

| | BL-0 | BL-1 | BL-2 | BL-3 | BL-4 | BL-5 | BL-6 | BL-7 |
|---|---|---|---|---|---|---|---|---|
| Up_L & Dw_L | | B | S | G | F | | | |
| Up_L & Dw_R | | G | S | B | F | | | |
| Up_R & Dw_L | | | S | G | B | B | | |
| Up_R & Dw_R | | B | S | G | F | | | |
| Up_L & Dw_L | | F | G | S | B | | | |
| Up_L & Dw_R | | F | B | S | G | | | |
| Up_R & Dw_L | B | B | G | S | | | | |
| Up_R & Dw_R | | F | G | S | B | | | |
| Up_L & Dw_L | | | | B | S | G | F | |
| Up_L & Dw_R | | | | G | S | B | F | |
| Up_R & Dw_L | | | | | S | G | B | B |
| Up_R & Dw_R | | | | B | S | G | F | |
| Up_L & Dw_L | | | | F | G | S | B | |
| Up_L & Dw_R | | | B | F | B | S | G | |
| Up_R & Dw_L | | | | B | G | S | B | |
| Up_R & Dw_R | | | | F | G | S | B | |

FIG. 4

COLUMN MULTIPLEXER FOR SEMICONDUCTOR MEMORIES

FIELD OF THE INVENTION

The present invention refers to the field of semiconductor memories and, in particular, to a selector or column multiplexer for semiconductor memories.

BACKGROUND OF THE INVENTION

As is known, for semiconductor memories the selection of a generic cell in the reading stage takes place by selecting the row to which the cell belongs to bring it to a selected potential and the column of the specific cell to connect it to a reading circuit. The reading circuit can, for example, perform current type reading of the cell. Selection of the column takes place via a suitable column multiplexer. In general, the column multiplexer comprises two input lines for supplying the two reading signals which, in the case of current reading, are composed of a sensing voltage and a ground voltage.

Furthermore, the multiplexer is provided with selective connection means necessary to select two specific column lines or bit lines among a plurality of column lines of the memory matrix to connect the two input lines to the two specific column lines. In conventional column multiplexers, transistors made, for example in MOSFET technology, are used to select the two specific column lines. The transistors have the gate terminal connected to a respective control line which has a level signal such as to activate or deactivate the transistor. The signal present on each control line is obtained by decoding an address signal.

It has been noted that, for particular applications, the functional characteristics and the architecture of conventional column multiplexers may not be satisfactory regarding both the complexity of managing the selection operations and concerning the overall dimensions when they are integrated into semiconductor structures. For example, it has been observed that, while for memories which adopt a so-called "NOR", or "double T", traditional structure, implementation of current reading of the memory cells using conventional multiplexers can be convenient, on the contrary for contactless and virtual ground memories, the limits of conventional multiplexers appear more significant.

SUMMARY OF THE INVENTION

An object of the present invention is to provide a column multiplexer having additional functions compared to those known in the art so that it can be used efficiently for particular operational requirements.

The object of the present invention is achieved by a column multiplexer for a memory matrix having memory cells arranged in rows and columns. The multiplexer includes input lines for input signals, a plurality of output lines for electrical connection to the columns of the matrix, a selective connection device for selecting, in a first operation mode, at least one output line of the plurality of output lines in such a way as to connect it selectively to the input lines. In the first operation mode, the selective connection device selects a first group of output lines among the plurality of output lines, including at least three first lines.

BRIEF DESCRIPTION OF THE DRAWINGS

For a better understanding of the invention and its advantages, a non-limiting illustrative embodiment thereof is described below and is illustrated in the appended drawings, in which:

FIG. 4 is a table illustrating the operation of the memory system of FIG. 3;

DETAILED DESCRIPTION OF THE PREFERRED EMBODIMENTS

Figure 1:
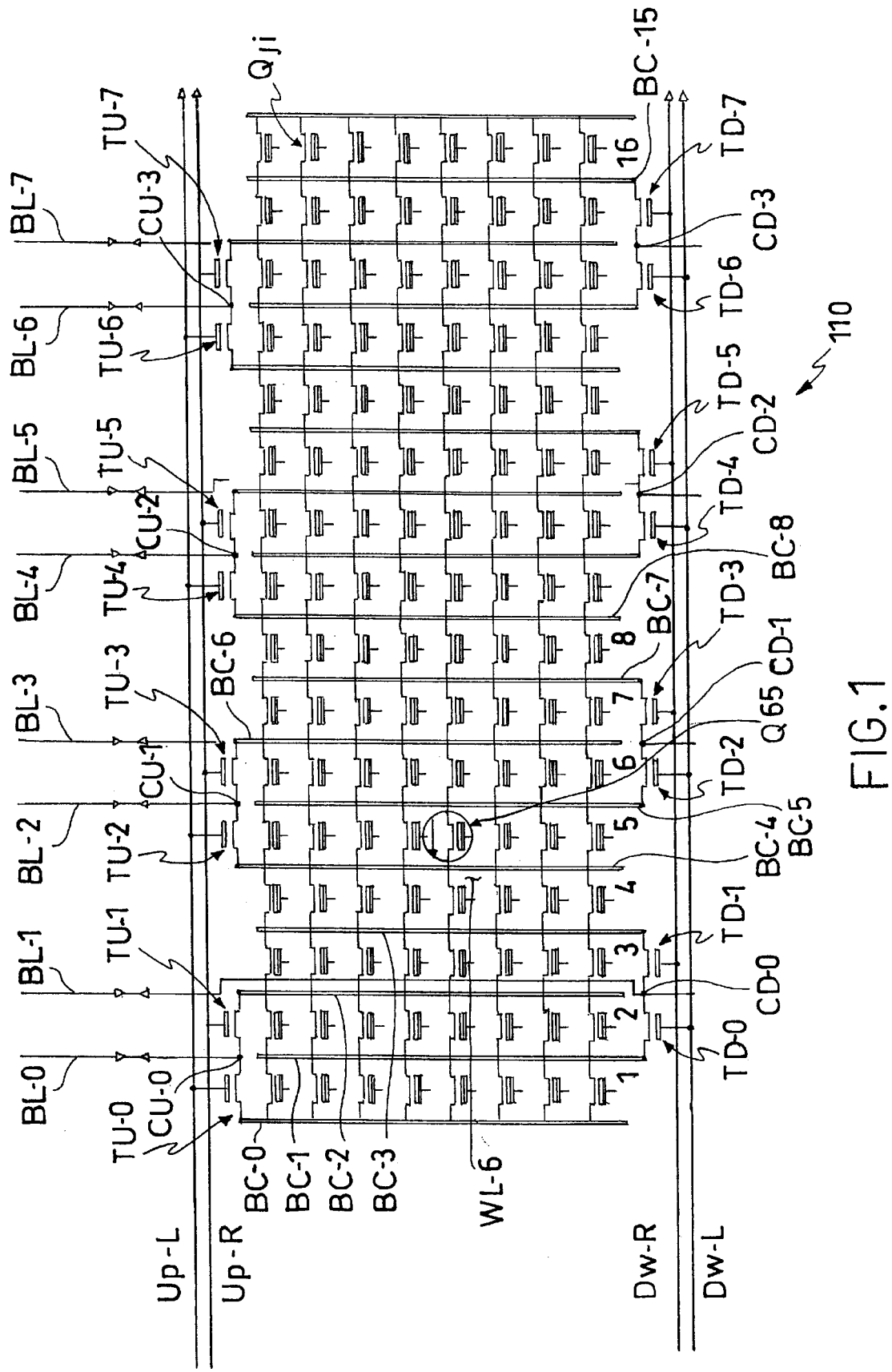
FIG. 1 is a schematic diagram of a memory matrix in accordance with the present invention.

FIG. 1 shows, schematically, a memory matrix or array 110 comprising a plurality of memory cells Qji arranged in rows and columns. In particular, for the cell Qji, the index "j" and the index "i" indicate, respectively, the number of the row and of the column in which the specific memory cell is disposed. The memory cells Qji may be semiconductor memory cells of any conventional type such as, for example, ROM, EPROM, EEPROM or Flash-EEPROM cells. Typically, the memory array 110 is formed on a semiconductor structure and, for example, by a conventional contactless technique.

Moreover, the architecture of the memory array 110 shown in FIG. 1 may be of the virtual-ground type. In general, virtual ground is understood to mean an operating mode in which the same bit line is not univocal and during a first reading or writing operation it can operate as a source electrode while during a further reading or writing operation it can operate as a drain electrode. In the memory array 110, each memory cell Qji has its gate terminal connected to a word line WL-j. For simplicity of representation, only a portion of the word line WL-6 which joins the gates of the cells of the sixth row is drawn in FIG. 1.

The memory array 110 also has a plurality of column lines, hereinafter referred to as cell bit lines BC-0, BC-1, BC-2, . . . BC-i, . . . BC-N, for example, formed by a plurality of parallel diffusions which extend in the direction of the columns of the array 110. Each memory cell Qji is connected, by respective terminals, (for example, its source and drain terminals) to two successive cell bit lines BC-i-1 and BC-i. For example, the memory cell Q33 is connected to the bit line BC-2 and to the subsequent bit line BC-3. All of the cells Qi3 disposed along the same column are connected in the same manner. The memory array 110 also comprises a plurality of reading lines (for example, made of metal) or, more briefly, bit lines BL-0, BL-1, BL-i, BL-N/2-1 which are divided, on the basis of the parity of the index i, into even bit lines BL-2$i$ and odd bit lines BL-2$i$+1.

As will become clearer from the following description, these bit lines BL-i enable the cell bit lines BC-i to be connected electrically to an external reading circuit (not shown in FIG. 1). In particular, each bit line BL-i of even or odd index can be connected to the cell bit line BC-i closest to it and having the same parity. In greater detail, each even bit line such as, for example, the bit line BL-0, is connected to a respective upper electrical contact CU-i, such as the contact CU-0 (represented schematically by a node) and each odd bit-line such as, for example, the bit line BL-1, is connected to a lower electrical contact CD-i, such as the contact CD-0. In FIG. 1, for clarity of representation, the odd bit lines BL-i which are to be connected to the respective lower electrical contacts CD-i-1 are shown only partially. The only odd bit line which is shown as a whole is the odd bit line BL-1 which reaches the lower contact CD-0.

The memory array 110 also has a plurality of upper selection transistors TU-0, TU-1, TU-i, . . . , TU-7 and a plurality of lower selection transistors TD-0, TD-1, TD-i, . . . , TD-7. For example, these upper and lower selection transistors may be formed by n-channel MOS-FETs. Each selection transistor TU-i or TD-i can be activated for conduction by the application of a suitable signal to its gate terminal. Moreover, the source and drain terminals of each upper selection transistor TU-i are connected, respectively, to a cell bit line of even index and to an upper electrical contact.

In the embodiment of FIG. 1, the upper selection transistor TU-0 connects the bit line BL-0 to the cell bit line -BC-0, via the upper contact CU-0, and the upper selection transistor TU-1 enables the bit line BL-0 to be connected to the cell bit line BC-2, via the upper contact CU-0. Similarly, the source and drain terminals of each lower selection transistor TD-i are connected, respectively, to a cell bit line of odd index and to a lower electrical contact.

In the embodiment of FIG. 1, the lower selection transistor TD-0 enables the bit line BL-1 to be connected to the cell bit line BC-1, via the lower contact CD-0 and the lower selection transistor TD-1 enables the bit line BL-1 to be connected to the cell bit line BC-3, via the lower contact CD-0. The upper selection transistors TU-i can be activated for conduction (and/or deactivated) via an upper left-hand selection line Up-L and an upper right-hand selection line Up-R which are connected to the gate terminals of the transistors. In particular, the upper selection transistors TU-i having even indices can be activated by the upper left-hand selection line Up-L and the upper selection transistors TU-i having odd indices can be activated by the upper right-hand selection line Up-R. Similarly, the lower selection transistors TD-i having even indices can be activated by a lower left-hand selection line Dw-L and the lower selection transistors TD-i having odd indices can be activated by a lower right-hand selection line Dw-R.

As will be described in greater detail below, each memory cell Qji is accessed by the simultaneous activation of an upper selection transistor and a lower selection transistor. For example, in the case of single-bit memory cells, in order to access the memory cell Q33, the word line corresponding to the third row must be activated and current must be brought to the cell bit line BC-2 and to the cell bit line BC-3. This access takes place by the activation of the upper right-hand selection line Up-R and of the lower right-hand selection line Dw-R, with consequent activation of the transistors TU-1 and TD-1 which connect the bit line BL-0 to the cell bit line BC-2 and the bit line BL-1 to the cell bit line BC-3, respectively.

With reference to EEPROM, EPROM or Flash-EPROM memory cells, it is assumed that each memory cell has its source terminal connected to a cell bit line BC-i of even index and its drain terminal connected to the next cell bit line BC-i+1, which thus has an odd index. In this case, to read, program (if the cell is programmable), or erase (if the cell is electrically erasable) each cell, a suitable voltage is supplied to the corresponding cell bit line BC-i of even index which is connected to the source of the cell in question and a further voltage is supplied to the cell bit line of odd index BC-i+1 which is connected to the drain terminal of the cell.

However, in the case of NROM cells which, as is known, are read in the opposite direction to that in which they are programmed, the cell bit line of even index will receive the source voltage during a cell-reading step and the drain voltage during a cell-programming step. In other words, for NROM memory cells, each cell bit line BC-i will adopt the role of a source terminal or of a drain terminal, according to the type of operation to be performed. It is pointed out that the architecture of the memory array 110 is particularly suitable for dual-bit NROM cells.

Figure 2:
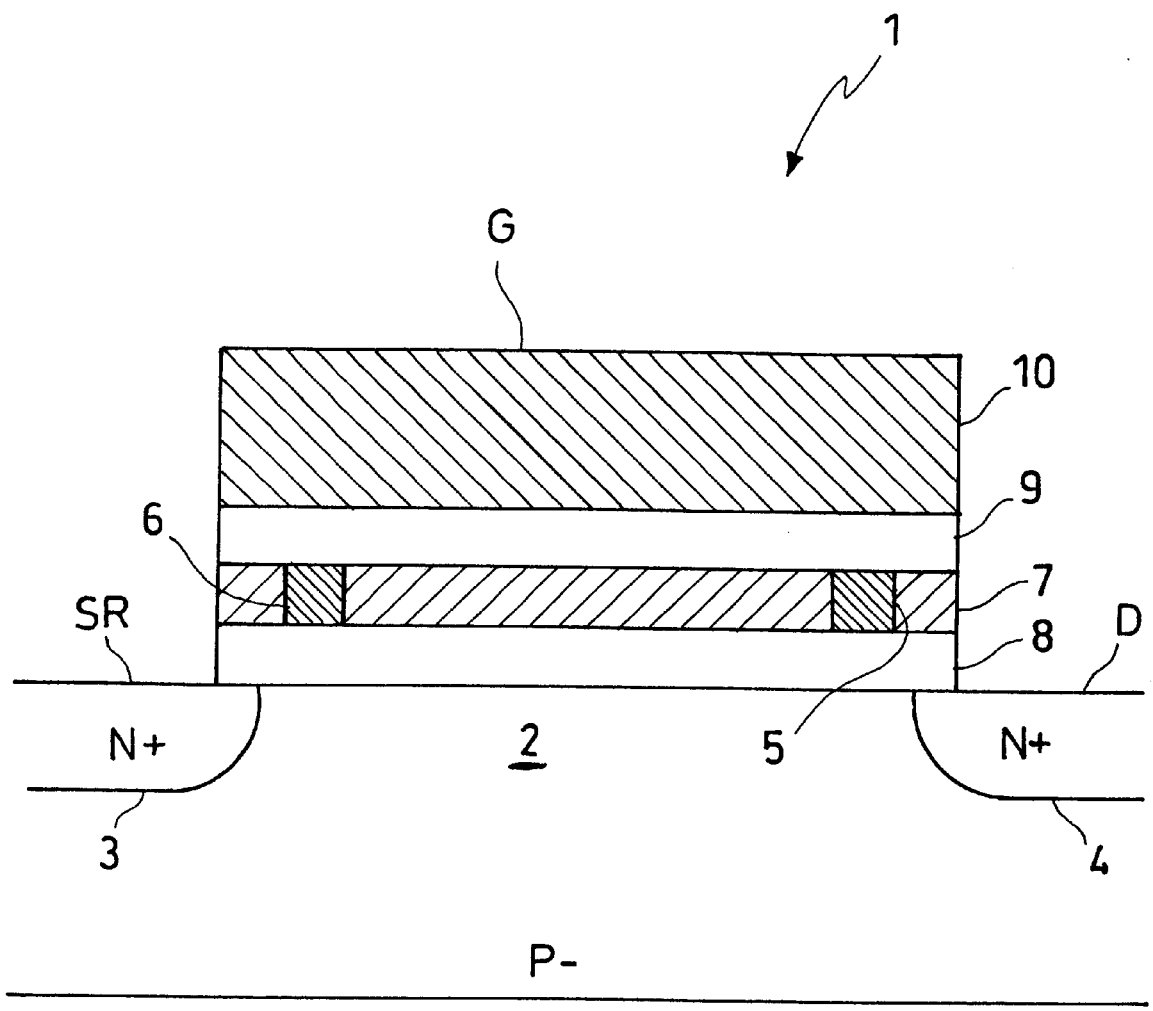
FIG. 2 is a cross-sectional schematic diagram of a dual-bit memory cell usable in the memory matrix of FIG. 1.

Dual-bit NROM cells have the characteristic of storing one bit for each side of the cell. A cell of this type is described in U.S. Pat. No. 6,011,725. For completeness of description, FIG. 2 shows schematically a dual-bit cell 1. The cell 1 has a single $p^-$-type doped channel 2 disposed between two $n^+$-type regions 3 and 4 which are intended, within the array 110 of FIG. 1, to be connected, respectively, to two cell bit lines. The cell 1 also comprises two areas 5 and 6, each of which can store an electric charge independently of the other. Each of these areas 5 and 6 defines one bit. In the dual-bit cell 1, the areas 5 and 6 are within a nitride layer 7 interposed between a first oxide layer 8 and a second oxide layer 9 on which a polysilicon layer 10, corresponding to a gate terminal G, is disposed. To read a first bit disposed in the area 6, that is, a bit disposed on the left, the region 4 (connected to one cell bit line) represents a drain region D and the region 3 (connected to a further cell bit line) represents a source region SR. The cell 1 is such as to cause solely the charge stored in the area 6 to influence the current in the channel 2. To read a second bit stored in the area 5, that is, a right-hand bit, the cell is read in the opposite direction and the region 4 represents the source region and the region 3 represents the drain region.

A dual-bit memory cell $Q_{65}$, which is interposed between the cell bit lines BC-4 and BC-5 and circled in FIG. 1, is considered by way of example. To read the cell $Q_{65}$, the word line WL-6 will be brought to a suitable voltage (for example, within a range of approximately 3.8 V–4 V). Moreover, a situation is considered, in which the left-hand bit of the cell $Q_{65}$, which is analogous to that stored in the area 6 of the dual-bit cell 1 of FIG. 2, is to be read. To read this bit with the use of a conventional current-sensing reading technique, it is necessary to cause the cell bit line BC-4 to operate as a drain terminal. To achieve this, the cell bit line BC-4 will have to operate as a sense-line and will be brought to a reading or sensing voltage V-BL equal to that generated by a sensing structure commonly used in a reading circuit. Typically, the sensing voltage V-BL is within the range of approximately 1.6 V–2 V.

The bit line BL-2 will consequently be brought to the sensing voltage V-BL and the upper selection transistor TU-2 will be activated for conduction by the activation of the upper left-hand selection line Up-L. In particular, this upper left-hand selection line Up-L can be brought to a standard supply voltage Vcc of the chip on which the memory array 110 is formed. Moreover, the cell bit line BC-5 will be brought to a reference or ground voltage GND (for example, 0V) so as to operate as a source terminal. The bit line BL-3 will consequently be brought to the ground voltage GND and the lower selection transistor TD-2 will be activated for conduction by the activation of the lower left-hand selection line Dw-L.

Table 1 summarizes the selection lines which are activated in this particular example and, by the symbols S and G, the types of voltages to which the bit lines necessary for reading the left-hand bits of all of the cells of the column 5, such as the cell $Q_{65}$, are brought. In particular, the symbol S indicates that the bit line of the respective column adopts the role of a sense-line and is thus brought to a sensing voltage V-BL, whereas the symbol G indicates that the bit line of the respective column is brought to a ground voltage GND.

TABLE 1

| Selection lines activated | Bit lines activated | |
| --- | --- | --- |
| Up-L & Dw-L | BL-2 | BL-3 |
| | S | G |

S → V-BL
G → GND

In a reading condition such as that described above, the current in the cell $Q_{65}$ is directed in the direction shown by an arrow in FIG. 1.

As is known, for a contactless memory array the memory cells are contiguous, that is, they are not separated by an appropriate insulating region. It is pointed out that, in these contactless structures, the reading signal, that is, the current present at the drain terminal of the memory cell to be read, may be established not only in that cell but also in contiguous cells. In other words, leakage currents, possibly of a purely capacitive nature (since they lack resistive paths) may arise, due to the contiguity of the memory cells and of the cell bit lines. The leakage currents are more marked the longer the sequence of adjacent virgin cells. These undesired phenomena are known as the neighbor effect.

Moreover, in the case of dual-bit cells, the need to enable each cell to be read in two different directions means that each current path is not univocal, rendering the formation of undesired paths for the reading current or sensing current even more likely. Because of these leakage currents, the reading current, from which information on the stored datum is to be derived, may be seriously degraded. Moreover, these currents do not have constant characteristics but are dependent on the states (virgin or programmed) of the memory cells adjacent that which is to be read.

When this degradation arises, it not only weakens the reading signal.in the normal mode of operation of the memory, but may be a source of misdirection during the checking stages which may follow a programming or erasure operation. This degradation renders the use of current-sensing techniques for contact less memory arrays more critical and difficult, if not completely impracticable. In the particular example described with reference to FIG. 1, the current in the memory cell $Q_{65}$ may affect not only the cell $Q_{65}$ and the cell bit lines BC-4 and BC-5, but also cells which are in lower-order columns such as columns 4 to 1.

Figure 3:
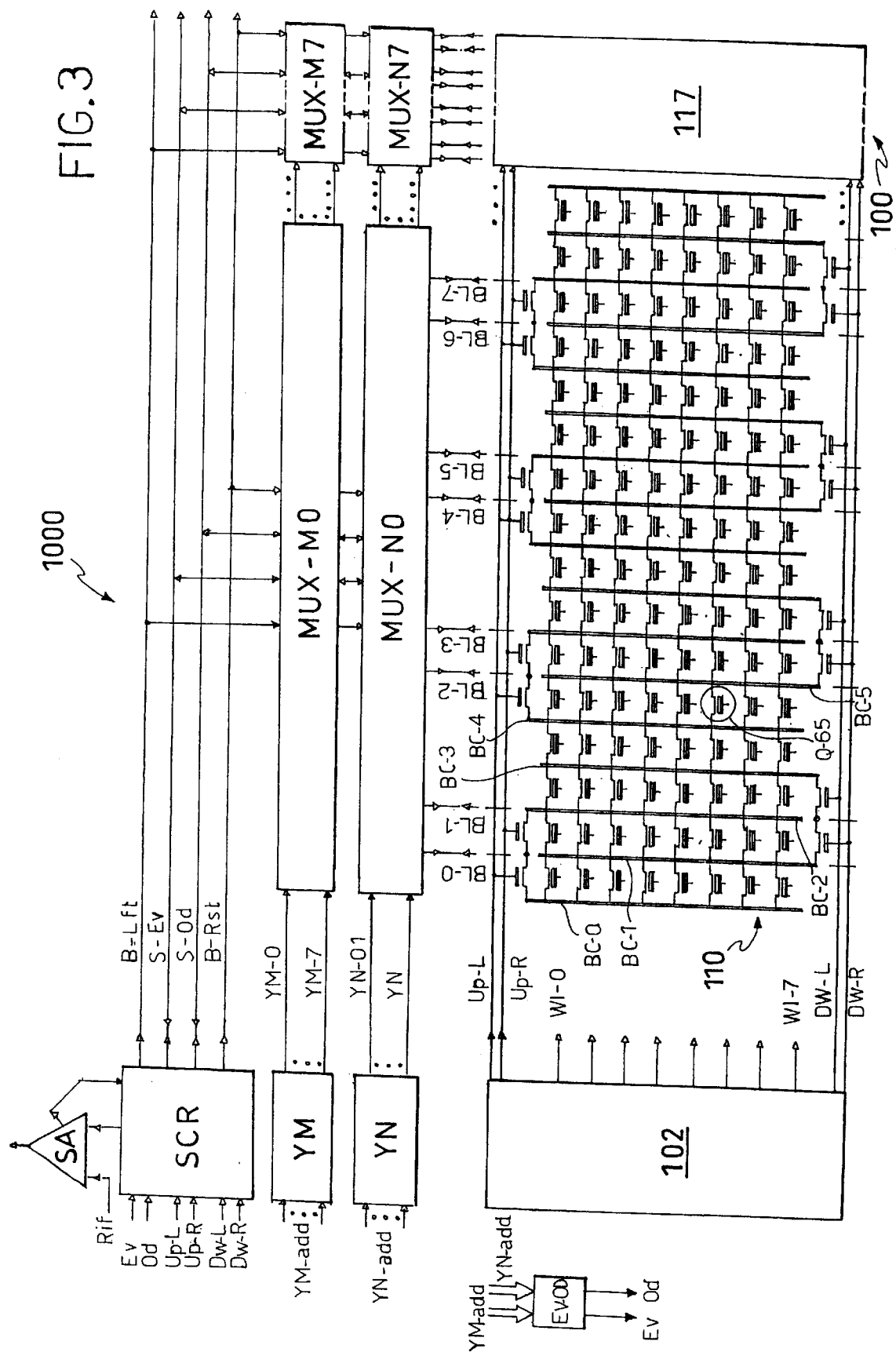
FIG. 3 is a schematic diagram of a memory system according to the invention, including a memory matrix of FIG. 1.

FIG. 3 shows schematically a preferred embodiment of a memory system 1000 according to the invention. The memory system 1000 opposes or even eliminates the establishment of the above-mentioned leakage currents. The method by which the memory system 1000 operates provides, during the reading of a memory cell, for an isolating or-biasing voltage V-Bias to be supplied to at least one cell bit line suitably contiguous to the cell bit line to which the sensing voltage VB-L is applied. In particular, the biasing voltage V-Bias produces, between these two cell bit lines, a potential difference such as to oppose the establishment of the leakage current between the two cell bit lines, in the semiconductor structure on which the memory cell is formed. More particularly, the closer the biasing voltage V-Bias is to the sensing voltage V-BL, the greater is the probability of achieving a condition in which the leakage current is substantially eliminated.

In detail, the memory system 1000 comprises a memory 100 divided into a plurality of memory arrays 110–117, a reading circuit, represented schematically by the symbol for a "sense amplifier" SA, and generating means for supplying the biasing voltage V-Bias. In the embodiment of FIG. 3, the generating means are formed by a "scrambler" circuit SCR. The reading circuit SA generates the sensing voltage V-BL and is preferably a current-reading circuit. As is known, a typical current-reading circuit comprises a reference memory cell and an operational amplifier to the inputs of which a signal derived from the reference cell and a signal derived from the cell being read and correlated with the state or programming of the cell are supplied.

The memory system 1000 also comprises a line and selection decoder 102, a first column decoder YM, a first plurality of multiplexers MUX-M0–MUX-M1, a second column decoder YN, and a second plurality of multiplexers MUX-N0–MUX-N7. In the embodiment of FIG. 3, the memory array 110 is structurally similar or identical to the memory array 110 described above with reference to FIG. 1. For clarity of representation, not all of the reference numerals shown in FIG. 1 are indicated in FIG. 3, but reference may be made to FIG. 1 in the following description. The other memory arrays which are included in the memory matrix 100, and of which only the memory array 117 is shown via a functional block, are similar to the memory array 110.

On the basis of an address code present at its input, the line and selection decoder 102 can supply, on the word lines WL-i, signals which identify the line of the memory cell Qji to be selected. The line and selection decoder 102 can also supply, on the left-hand and right-hand upper selection lines Up-L and Up-R, and on the left-hand and right-hand lower selection lines Dw-L and Dw-R, signals which activate/deactivate conduction of the upper selection transistors TU-0–TU-7 and of the lower selection transistors TD-0–TD-7 present in each memory array 110–117. It should be noted that the scrambler SCR, a particular embodiment of which will be described below, is not a conventional circuit structure for non-volatile memories.

On the basis of a plurality of input signals carrying information relating to the path selected in the memory matrix for the reading of a specific cell, the scrambler SCR supplies, at respective outputs and in accordance with a suitable-distribution, two cell-reading signals and the biasing voltage V-Bias. In particular, the reading signals are the sensing voltage V-BL for the reading of the memory cell and the ground voltage GND which serves to bring the memory cell selected to a reading condition, that is, to-activate its conductivity.

The plurality of input signals to the scrambler SCR comprises two parity signals Ev, Od and four selection signals Up-L, Up-R, Dw-L, Dw-R which are the same as the signals that are present on the homonymous selection lines described above. The parity signal Ev is, for example, a binary signal having a high or low logic level when the index i of the bit line Bl-i which is to be brought to a sensing voltage is even or odd, respectively, during the reading of a memory cell. In complementary manner, the parity signal Od has a high or low logic level when the index i of the bit line Bl-i which is to be brought to a sensing voltage is odd or even, respectively, during the reading of a memory cell. The parity signals Ev and Od can be derived from address signals by a suitable decoder EV-OD the construction of which will be clear to a person skilled in the art.

The scrambler SCR has a plurality of output lines comprising a left-hand biasing line B-Lft, a right-hand biasing line B-Rgt, an even sensing line S-Ev, and an odd sensing line S-Od. The biasing voltage V-Bias and the ground voltage GND may be made available on any of the four output lines listed above. The even and odd sensing lines S-Ev and S-Od are intended to make the sensing voltage V-BL available according to the parity of the index of the bit line Bl-i involved in the reading operation. In greater detail, the scrambler SCR makes the sensing voltage V-BL available on the even sensing line S-Ev or on the odd sensing line S-Od, respectively, according to whether the bit line BL-i has an even or odd index.

It is pointed out that the left-hand and right-hand biasing lines B-Lft, B-Rgt are monodirectional, whereas the sensing lines S-Ev and S-Od are bidirectional, so that the signal correlated with the state of programming of the cell, that is, the current which is established in the memory cell being read, can reach the sense amplifier SA via the scrambler SCR. Moreover, one of the four output lines S-Ev, S-Od, B-Lft, B-Rgt will have a floating voltage V-Floating during a reading operation. The four output lines S-Ev, S-Od, B-Lft, B-Rgt are connected to each of the multiplexers belonging to the first plurality of multiplexers MUX-M0–MUX-M1. Each multiplexer of this first plurality can be selected by the first column decoder YM.

The first column decoder YM can receive, as an input, a first encoded address signal YM-add, and can supply, on output lines YM-0–YM-7, first control signals which can activate/deactivate one of the multiplexers belonging to the first plurality MUX-M0–MUX-M1. Each of the multiplexers of the first plurality MUX-M0–MUX-M1 has four output lines which can be put into connection with the four input lines S-Ev, S-Od, B-Lft, B-Rgt of the respective multiplexer, in dependence on the selection performed by the first column encoder YM. It is pointed out that, by selecting at least one multiplexer of the first plurality MUX-M0–MUX-M1, the first column encoder YM enables at least one memory array of the plurality of arrays 110–117 to be selected.

The four output lines of each multiplexer of the first plurality MUX-M0–MUX-M1 are also connected to a corresponding multiplexer of the second plurality of multiplexers MUX-N0–MUX-N7. Each multiplexer MUX-N0–MUX-N7 of said second plurality, according to the invention, enables the respective four input lines to be connected to four appropriate bit lines to be selected from among the plurality of bit lines BL-0–Bl-7 with which each memory array is provided. The connection between the input lines to each multiplexer of the second plurality MUX-N0–MUX-N7 and the appropriate four bit lines of the plurality BL-0–BL-7 is controlled by the second column decoder YN.

The second column decoder YN can receive, as an input, a second encoded address signal YN-add and can supply second control signals on eight output lines YN-0,1–YN-9, 10. These second control signals control each multiplexer of the second plurality MUX-N0–MUX-N7. According to a particular embodiment of the invention, the first and second column decoders YM and YN, together with the first and second pluralities of multiplexers MUX-M0–MUX-M7 and MUX-N$\phi$–MUX-N7, enable the four output lines S-Ev, S-Od, B-Lft, B-Rgt of the scrambler SCR to be connected to the four appropriate bit lines of a selected memory array, on the basis of the address signals YM-add and YN-add. In particular, the memory system 1000 operates by supplying the reading signals, that is, the sensing voltage V-BL and the ground voltages GND to the cell bit lines to which the memory cell to be read is connected, and at least one biasing voltage V-Bias which can oppose the development of leakage currents to one or more cell but lines than those to which the cell being read is connected.

Before a specific example of the operation of the memory system 100 is described in detail, the Table shown in FIG. 4 will be described. This table indicates which reading and biasing signals, suitably generated by the scrambler SCR, should be applied to a memory array such as the array 110 to read a particular memory cell in accordance with the method of the present invention. As described for Table 1, the memory cell to be read and the direction of reading selected can also be identified from the indication of the configuration of the voltages provided by the table of FIG. 4. It is pointed out that, for simplicity of description, the table of FIG. 4, which has a structure similar to that of Table 1, does not show the particular word line WL-j selected.

In each line of the table of FIG. 4, the two selection lines (included amongst the lines Up-L, Up-R, Dw-L, Dw-R) which will be activated for the reading of a predetermined memory cell are indicated on the right-hand side of the table. One bit line of the plurality of bit lines BL-0–BL-7 of the array 110 is indicated in each column in the upper portion of the table of FIG. 4. In each cell of the table of FIG. 4, the particular voltage to which the respective bit line is to be brought in accordance with the particular method described according to the invention is indicated by one of the symbols S, G, B, F.

As stated above, the symbol S indicates that, for the operation of the memory system 1000, the bit line of the respective column will adopt the role of a sense-line and will therefore be brought to a sensing voltage V-BL. The symbol G indicates that the bit line of the respective column will be brought to a ground voltage GND. The symbol B indicates that the bit line of the respective column of the table of FIG. 4 will be brought to the biasing voltage V-Bias, and the symbol F indicates that no predetermined potential will be imparted to the corresponding bit line and that this bit line is therefore left floating.

For example, it is assumed that the cell $Q_{65}$ is to be read in the same direction of reading as is shown in FIG. 1. The memory cell $Q_{65}$ is disposed between the cell bit lines BC-4 and BC-5. To read this memory cell $Q_{65}$, the first row of the table of FIG. 4 is considered. It can be seen that, as indicated in this first line of the table, the selection lines Up-L and Dw-L should be activated. The table of FIG. 4 also indicates that the bit line BL-2 should be brought to the sensing voltage V-BL and the bit line BL-3 should be brought to the ground voltage GND. In this situation, as already described with reference to Table 1, the cell bit line BC-4 is brought to the biasing voltage V-BL and the cell bit line BC-5 is brought to the ground voltage GND.

The table of FIG. 4 also indicates that (together with the activation of the lower left-hand and upper left-hand selection lines Dw-L and Up-L) the bit line BL-1 is brought to the biasing voltage V-Bias and the bit line BL-4 is left floating. This corresponds to saying that the cell bit line BC-1 is brought to the biasing voltage V-Bias and that the cell bit line BC-8 is left floating. It should be noted that, if a voltage V-Bias substantially equal to the sensing voltage V-BL is generated, by means of the scrambler SCR, between the two cell bit lines BC-4 and BC-1, there is a substantially zero potential difference. By rendering this potential difference substantially zero, the possibility of a leakage current developing from the cell bit line BC-4 towards the cell bit line BC-1 and, consequently, towards the cell bit lines which have indices "i" of less than four, is thus reduced or prevented.

The cell bit line BC-1 adopts the role of a bit line blocking the leakage current. It is pointed out that other cell bit lines, such as the cell bit lines BC-3 and BC-2, are closer to the bit line BC-4 and could therefore better perform the role of blocking the leakage current. In this connection it should be noted that the selection of the cell bit line BC-4 as the blocking bit line is due to the fact that, to bring the cell bit lines BC-3 and BC-2 to the voltage V-Bias=V-BL, it would be necessary to activate the selection line Dw-R and the selection line Up-R, respectively. As is clear from the foregoing description of the methods by which a predetermined memory cell is accessed, the activation of these other selection lines is incompatible with the activation of the selection lines Dw-L and Up-L which is necessary to access the cell $Q_{65}$. Owing to the specific architecture of the memory array described, the cell bit line BC-1 is the closest usable cell bit line to the cell bit line BC-4.

It is pointed out that, by virtue of the teachings of the present invention, it is possible to oppose the development of leakage currents during the reading of a predetermined cell, to the extent of eliminating them. It is therefore possible to avoid the use of expensive and complex dynamic approaches but to achieve satisfactory performance by performing a current reading.

According to a particular embodiment of the invention, to read a memory cell, the memory system 1000 operates in the following manner. On the basis of the address signals YM-add and YN-add, the decoder EV-OD provides the values of the parity signals Ev and Od which are supplied to the-scrambler SCR. On the basis of address codes, the line and selection decoder 102 generates, on the word line WL-i, the signals which identify the row of the memory cell Qji to be selected and the signals Up-L, Up-R, Dw-L, Dw-R. Since, in the embodiment of FIG. 1, the selection transistors TU-0–TU-7 and TD-0–TD-7 are of the n-type, the signals Up-L, Up-R, Dw-L, Dw-R are of high logic level when the selection transistors which are present on the respective selection line are to be activated for conduction and are of low logic level when conduction of the transistors is to be deactivated.

The signals Up-L, Up-R, Dw-L, Dw-R are also sent to the scrambler SCR which generates the output voltages V-Bias, V-BL, GND, and V-floating on the lines B-Lft, B-Rgt, S-Ev, and S-Od. In particular, the voltages V-Bias, V-BL, GND, and V-floating are distributed on the lines B-Lft, B-Rgt, S-Ev, and S-Od in a manner such as to conform to the configurations of Table 4. By generating the signals YM-0–YM-7, the first column decoder YM selects a single multiplexer of the first plurality MUX-M0–MUX-M1. The multiplexer thus selected will have the voltages V-Bias, V-BL, GND and V-Floating on its four output lines. By suitably generating the signals YN-0,1–YN-14,15, the second column decoder YN causes a single multiplexer of the plurality MUX-N0–MUX-N7 to have, as outputs, the voltages V-Bias, V-BL, GND, and V-Floating, distributed appropriately to some of the bit lines of BL-0–BL-7. Thus, the sensing voltage V-BL and the ground voltage GND are supplied to the memory array selected so as to permit reading of the selected cell, and the biasing voltage V-Bias and the floating voltage V-Floating are supplied to the array in a manner such as to oppose the development of leakage currents.

Figure 5:
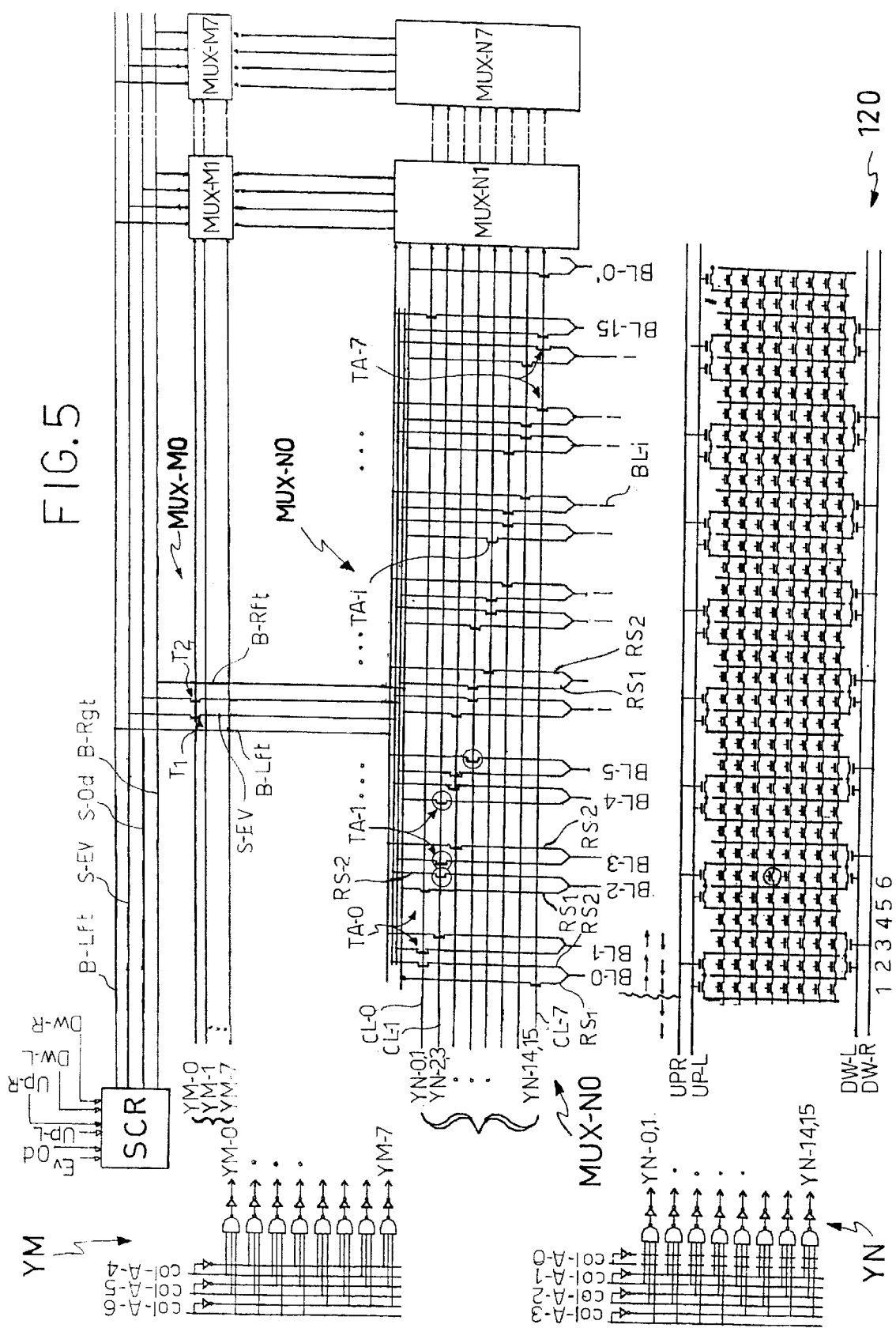
FIG. 5 shows a particular form of a column multiplexer according to the invention.and used in the system of FIG. 3.

FIG. 5 shows a memory system 2000 similar to the memory system 1000 described above with reference to FIG. 4. In FIG. 5, all of the components which are identical or similar to those described above are indicated by the same reference numerals. For simplicity of representation, a single memory array 120 is shown in FIG. 5 and the sense amplifier SA, the line and selection decoder 102, and the decoder EV-OD are not shown. The memory array 120 is structurally similar to the array 110 described above but comprises a larger number of columns of memory cells than are included in the memory array 110. In the memory system 2000, specific embodiments of the first and second column decoders YM and YN are shown.

The first and second column decoders YM and YN are provided, respectively, with three inputs col-A4–col-A6 and with four inputs col-A0–col-A3 for receiving, altogether, an input,code such as a 7-digit binary word. The column decoders YM and YN are also provided, respectively, with outputs YM-0–YM-7 and YN-0,1–YN-14,15 for making available the first and second control signals, respectively. The first and second decoders YM and YN are typically combinatory networks and comprise, in the embodiment shown, NAND logic gates 121 with three inputs and NOT logic gates 122 and 123. For each input signal col-A0–col-A6, a respective negated signal is supplied via the NOT logic gate 122. The input signals and/or their negated signals are supplied to the inputs of corresponding NAND gates 121 and the outputs of these gates are negated by the NOT gates 123.

The multiplexer MUX-M0 comprises, as inputs, the two lines B-Lft and B-Rgt which are applied directly as outputs of the multiplexer. The two input lines S-Ev and S-Od of the multiplexer MUX-M0 are connected to respective activation/deactivation transistors T1 and T2. For example, the activation/deactivation transistors T1 and T2 are two n-channel MOSFET transistors. Both of the gate terminals of the activation/deactivation transistors T1 and T2 are connected to the output YM-0 of the first column decoder YM. When a high logic level signal (a logic 1) is present at this output YM-0, the two transistors T1 and T2 are activated for conduction and the signals which are present on the lines S-Ev and S-Od, and which are generated by the scrambler SCR, are applied as outputs of MUX-M0 or, conversely, the signals coming from the memory array 120 are applied as inputs to the scrambler SCR. When a low logic level (a logic 0) is present at the output YM-0, the electrical connection between the output lines S-Ev and S-Od of the scrambler SCR and the output of the MUX-M0 is interrupted.

The multiplexers MUX-M1–MUX-M7 are similar to MUX-M0 and each has two activation/deactivation transistors (not shown), similar to the transistors T1 and T2. For each multiplexer MUX-M1–MUX-M7, the respective activation/deactivation transistors have their gate terminals connected to a different output line YM-1–YM-7. The multiplexer MUX-N0 formed in accordance with the invention comprises, as inputs, the two lines S-Ev and S-Od and the two lines B-Lft, B-Rgt and, as outputs, the bit lines BL-0–BL-15. A further bit line BL-0' is shown in FIG. 5. These bit lines BL-0–BL-15 have the same function as the bit lines described with reference to FIGS. 1 and 3. It is pointed out that known multiplexers use only two input lines for the reading signals and the lines B-Lft, B-Rgt thus-represent additional input lines for this multiplexer.

The multiplexer MUX-N0 is provided with selective connection means which enable selection of at least three of the bit lines BL-0–BL-15, in one specific mode of operation. In the example, specific mode of operation is understood to mean the reading operation of one particular reading cell where biasing or insulation of appropriate cell bit lines is also performed. Moreover, it is pointed out that in the operation mode these at least three bit lines are selected at substantially the same time.

The selection performed by the selective connection means enables selective connection of the input lines S-Ev and S-Od, B-Lft, B-Rgt to at least three of the bit lines BL-0–BL-15. Preferably, the selective connection means enable the input lines S-Ev and S-Od, B-Lft, B-Rgt to be selectively connected to four of the bit lines Bl-0–BL-15. In greater detail, in the described example, the selective connection means enable the lines S-Ev and S-Od, corresponding to the reading signals, to be connected to two appropriate first bit lines to be selected among the plurality of bit lines Bl-0–Bl-15. Moreover, the selective connection means enable the two additional input lines B-Lft, B-Rgt, available for the biasing voltage V-Bias and the floating voltage V-Floating, to be connected to two second bit lines distinct from the first and to be selected among the same plurality of bit lines BL-0–BL-15.

In the example of FIG. 5, the selective connection means comprise first selection lines or branches RS1, second selection lines or branches RS2, a plurality of activation/deactivation transistors TA-0–TA-7 and a plurality of control lines CL-0–CL-7. The first and second selection branches RS1 and RS2 connect the lines B-Lft, B-Rgt, S-Ev and S-Od to the bit lines BL-0–BL-15. In the particular example of FIG. 5, each bit line BL-i is connected to a selection branch RS1 (shown on the left of the respective bit line in FIG. 5) and to a selection branch RS2 (shown on the right of the respective bit line in FIG. 5). Moreover, each bit line BL-i has one selection branch RS1 (RS2) connected to one of the lines B-Lft, B-Rgt and the other RS2 (RS1) connected to one of the lines S-Ev, S-Od.

The plurality of activation/deactivation transistors TA-0–TA-7 is associated with the first and second plurality of selection branches RS1 and RS2. These activation/deactivation transistors enable specific output bit lines MUX-N0 to be selected, activating or deactivating to/from conduction the selection branches to which they are associated. Preferably, a single activation/deactivation transistor is associated with each selection line RS1, RS2.

The plurality of control lines CL-0–CL-7 is connected to the column decoder YN and is intended to supply control signals to the activation/deactivation transistors TA-0–TA-7. Each of the second control signals of the output lines YN-0,1–YN-14,15 can adopt an activation logic level and a deactivation logic level such as to activate/deactivate the activation/deactivation transistors TA-0–TA-7 to/from conduction. In other words, each first control signal, depending on the logic level adopted, enables activation/deactivation (activation logic level/deactivation logic level) of the corresponding control line so as to control the selective connection means.

For example, each activation/deactivation transistor Ta-I is a MOSFET having its gate terminal connected to a control line of the eight lines CL-0–CL-7 and having its drain and source terminals connected to the respective selection line. It is pointed out that each of the control lines CL-0–CL-7 is advantageously connected to at least two activation/deactivation transistors of the plurality TA-0–TA-7.

Preferably, each of the control lines is connected to at least three activation/deactivation transistors of the plurality TA-0–TA-7. In this way, supplying to a single control line a control signal with a logic value suitable for the activation to conduction of the activation/deactivation transistors connected to said control line, it is possible to connect the input lines of the multiplexer MUX-N0 to at least three bit lines, at substantially the same time.

In particular, in the example shown in FIG. 5, each of the control lines CL-0–CL-7 is connected, within the multiplexer MUX-N0, to four activation/deactivation transistors of the plurality TA-0–TA7 (the activation/deactivation transistor connected to the bit line BL-0' is excluded from the count). The multiplexers MUX-N1–MUX-N7 are similar to the multiplexer MUX-N0 described. When the multiplexer MUX-N0 is in operation, the control signals YN-0,1–YN-14,15 control the activation/deactivation transistors appropriately so as to distribute the reading voltages V-BL and GND and the biasing voltages V-Bias and V-Floating to the bit lines.

For example, reference is made to the third line of the table of FIG. 4. It is clear from the foregoing descriptions that this third line relates to the reading of a memory cell disposed between the cell bit lines BC-5 and BC-6. In FIG. 5, a possible memory cell affected by this reading has been indicated by a circle in column 6 of the array 120. The bit line in which the sensing voltage V-BL is to be made available is the bit line BL-2, that is, an even bit line, whereas the ground voltage GND is to be available on the bit line BL-3.

In the particular example considered, the biasing voltage V-Bias which will be supplied to the bit lines BC-9 and BC-10 will be made available on both of the bit lines BL-4 and BL-5. The effect in reducing the development of leakage currents is thus particularly efficient. The transistors T1 and T2 of MUX-M0 will be considered to be activated for conduction. In this situation, the activation/deactivation transistor (circled in FIG. 5) of the branch RS2 connected to the bit line BL-2 is activated for conduction. This causes the desired voltage V-BL associated with the output line S-Ev from the scrambler SCR to be available on the bit line BL-2. Moreover, the activation/deactivation transistor (circled in FIG. 5) of the branch RS1 connected to the bit line BL-3 is also activated for conduction. The desired voltage GND associated with the output line S-Od from the scrambler SCR is thus available on the bit line BL-3.

Similarly, the two transistors (circled in FIG. 5) corresponding to the selection branches RS1 of the bit line BL-4 and RS2 of the bit line BL-5 will be activated for conduction. Selection of the bit line BL-5 occurs by activating the control line CL-3. This causes the voltage V-Bias present on the lines B-Lft and B-Rgt to be made available on the bit lines BL-4 and BL-5 (in order to be supplied to the cell bit lines BC-9 and BC-10).

It should be noted that the multiplexer MUX-N0, for each reading operation of a memory cell, selects a group of four contiguous bit lines (for example, bit lines BL-2, BL-3, BL-4 and BL-5), in other words, which are consecutive to each other according to the order in which they are arranged. In particular, three of the four bit lines are selected via a control signal appropriately supplied to a single control line (for example, the line CL-1) and the fourth bit line is selected via activation of another control line (for example, the line CL-3). Moreover, when passing from a first operation mode to a second operation mode, in which at least three of the four bit lines previously selected are necessary, it might not be necessary to activate a control line different from the one activated for the first operation mode.

For example, for a reading operation of the thirteenth row of the table in FIG. 4, it can be noted that the bit-lines BL-2, BL-3, BL-4 can still be selected by activating the control line CL-1. The bit line BL-1 can be selected by activating the control line CL-2. In other cases, the second operation mode may require the use of three of the four available bit lines which do not all belong to the first group of bit lines selected in the first operation mode. In this case, it will be necessary to modify the single control line activated for the selection of the three bit lines.

A situation should be considered in which, when passing from a first to a second operation mode, passing from activation of a first control line (for example, the line CL-0) to activation of a second control line contiguous to the first (for example the control line Cl-1) also occurs. In this case, it should be noted that, in the multiplexer MUX-N0, activation of the second control line involves selection of a second group of bit lines shifted by at least one bit line or, preferably, two bit lines compared to the first group. For example, in a first operation mode, the bit lines BL-2, BL-3, BL-4, BL-5 are selected by activating the control lines CL-1 and CL-3. However, in a second operation mode, the bit lines BL-4, BL-5, BL-6 BL-7 are selected by activating the control line CL-2 (contiguous to line CL-1).

The second group of bit lines selected is shifted by two positions compared to the first group, i.e. it comprises the bit lines BL-6, BL-7 contiguous to each other and contiguous to the extreme bit line of the first group (bit line BL-5) but not included in the first group. In this embodiment, the operation mode of the multiplexer MUX-N0 can be defined as the "module 2" type. It should be noted that the multiplexer MUX-N0 according to the invention enables the biasing voltage V-Bias to be supplied to the memory matrix without significantly complicating or altering the method by which the memory cell is accessed for reading. Moreover, this multiplexer is compatible with the current reading technique.

In particular, the module 2 type operation and the above-described ability to activate a single control line in order to activate three activation/deactivation transistors for conduction at substantially the same time are particularly, advantageous characteristics. In fact, this particular architecture enables the signals from four input lines (that is, the lines S-Ev, S-Od and the additional lines B-Lft and B-Rgt) to be distributed to the plurality of bit lines (BL-0–BL-15) while, at the same time, having uniformity in the electrical layout and a small number of lines activated simultaneously. In this connection, it is pointed out that, in conventional multiplexers, each control line is connected to a single activation/deactivation transistor relating to a memory array.

Moreover, the teachings of the present invention relating to the multiplexer MUX-N0 are applicable not only to the particular situation in which the additional signal is used to reduce the leakage current, but also for any other purpose which may be identified and independent of the type of signal (analogue and/or digital) supplied to the memory matrix.

With reference to the second column decoder YN, it should be noted that it is of the incomplete decode type, i.e. the number of outputs Nout is inferior to the number of possible binary combinations of the inputs Nin: Nout<$2^{Nin}$. In particular, it is pointed out that the second column decoder has four inputs (col-A0–col-A3) and eight outputs (YN-0,1–YN14,15) instead of the sixteen used in conventional decoders. The second column decoder YN shown in FIG. 5 appears "transparent" compared to the input col-A0, i.e. it does not use the signal present on said input to obtain the output signals. This is also made possible thanks to the above-described architectural and functional characteristics of the multiplexer MUX-N0.

The column selection system comprising the multiplexer MUX-N0 and the second column decoder YN present advantages in terms of dimensions when integrating in the semiconductor structure. In fact, said system is smaller in size than conventional technologies as regards the YN decoder, the bus composed of decoder output lines and the bus composed of the multiplexer control lines. The multiplexer MUX-N0 can be manufactured using conventional integration techniques.

Figure 7A:
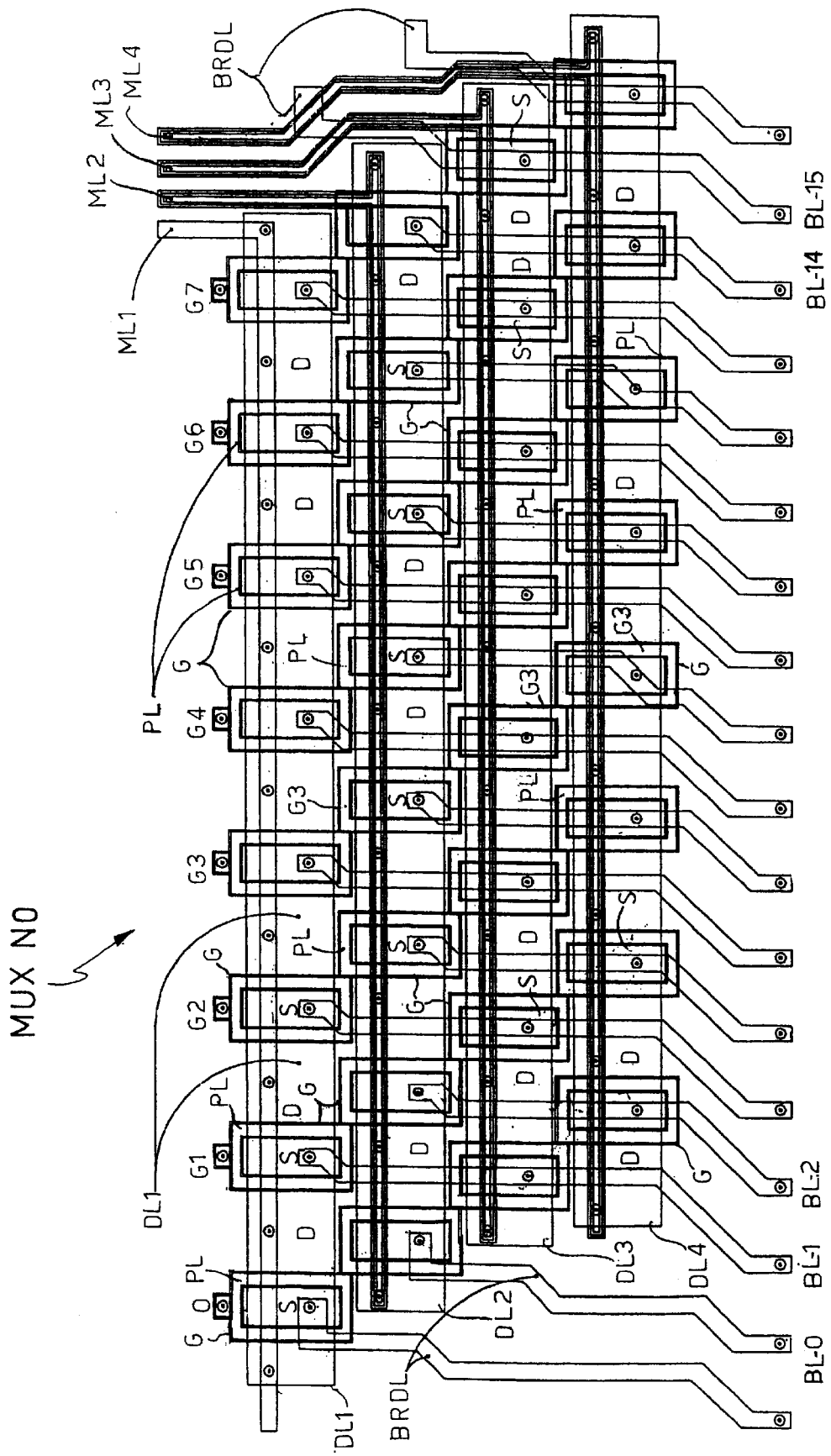
FIGS. 7a and 7b are schematic diagrams of a preferred architecture of a single column multiplexer and two connected column multiplexers respectively, according to the invention.

FIG. 7a shows a particular layout of the above-described multiplexer MUX-N0 in which the activation and deactivation transistors are channel N MOSFET. The multiplexer MUX-N0 shown in FIG. 7a comprises four parallel diffusion lines DL1–DL4 (for example, type P diffusion, forming the drain terminals D of the activation/deactivation transistors TA-0–TA-7 shown in FIG. 5), diffused regions S (for example type P regions forming the source terminals of the transistors TA-0–TA-7). In the embodiment shown in the figure, the polysilicon layers PL have a rectangular shape.

The terminals of gate G of the activation/deactivation transistors associated to the line DL1 have a corresponding contact G0–G1 intended to be connected to a column line CL-0–CL-7 described with reference to FIG. 5. Moreover, the gate G terminals associated to a diffusion DL1–DL4 are in direct contact with the gate G terminal associated to the contiguous diffusion DL1–DL4. This enables connection between a single control line CL-0–CL-7 and four gate G terminals of four activation/deactivation transistors. For purposes of clarity, the four gate terminals connected to each other and associated to the diffusion DL1–DL4 are indicated with the same reference G3 in FIG. 7a.

Moreover, the multiplexer MUX-N0 comprises four metal lines ML1–ML4 which make contact with the drain terminals D of the diffusion DL1–DL4 respectively. The lines ML1–ML4 are intended to be connected to the output lines B-Rgt, S-Qd, S-Ev, B-Lgt of the scrambler SCR. Every bit line BL-0–BL-15 is manufactured with metal lines such as to make contact with two source regions S of two activation/deactivation transistors. Further metal lines BRDL are placed on the borders of the structure shown in FIG. 7a so as to enable connection of the MUX-N0 to another multiplexer, such as the multiplexer MUX-N1 shown in FIG. 5.

It is pointed out that, according to the above-described layout, the activation/deactivation transistors are placed in pairs, in other words in such a way that two contiguous transistors share the drain terminal D. This makes it possible to fuse the common nodes of the transistors so obtaining a considerable saving of space. Space is an issue for the structure of FIG. 7a and is, preferably, intended to be associated to the selection of very small memory cells. Moreover, the activation/deactivation transistors are developed in the structure of the MUX-N0 without giving rise to fragmentation which would involve the necessity for insulating spaces so compromising formation of the structure itself.

Figure 7B:
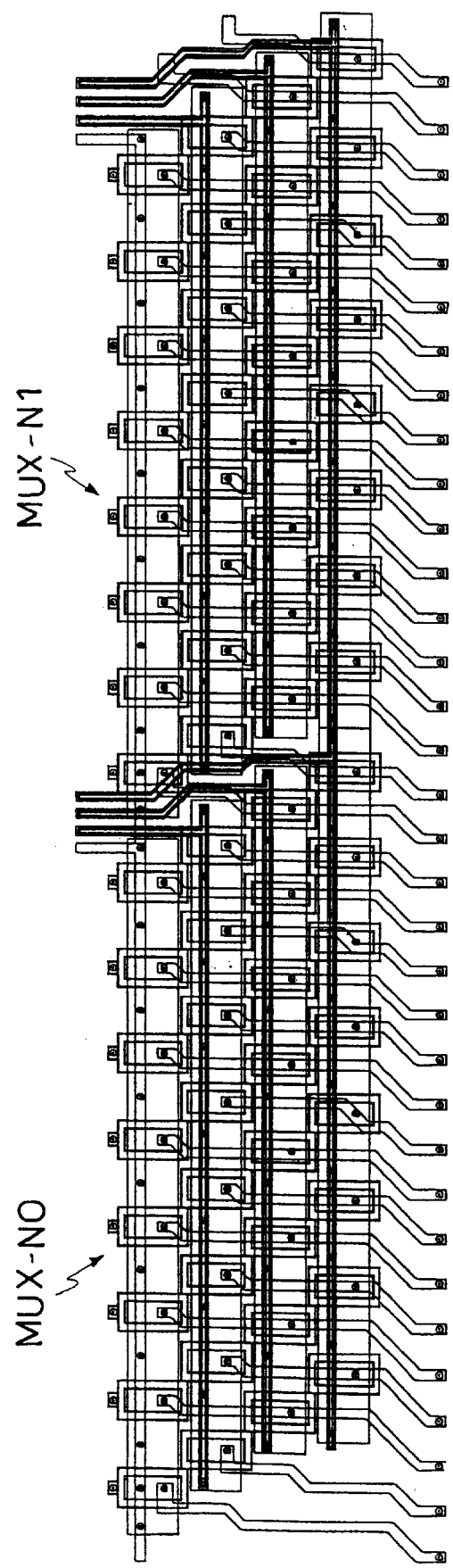

The line ML1, the bit lines BL-0–BL-15 and the border lines BRDL are formed with a level of metallization different form that of the lines ML2–ML4 (represented with a double line in FIG. 7a). The use of two metallization levels enables access to the lines ML1–ML4 even when several multiplexer elementary structures are connected to each other. Concerning this, FIG. 7b shows the multiplexer MUX-N0 connected to a second multiplexer, for example the MUX-N1, by means of the border metal lines BRDL.

Figure 6:
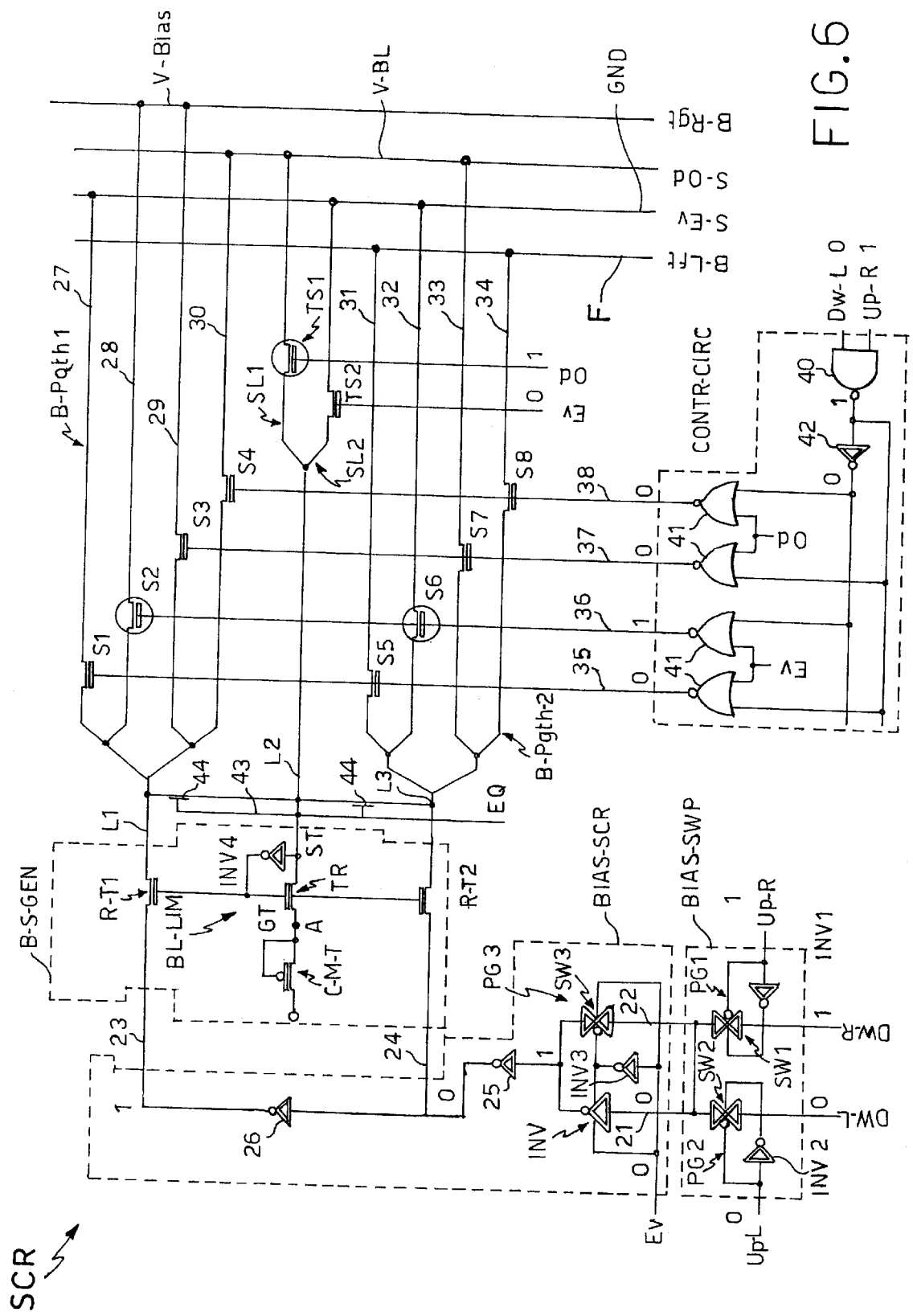
FIG. 6 is a schematic diagram of an embodiment of a scrambler circuit used in the system of FIG. 3.

FIG. 6 shows a preferred embodiment of the scrambler SCR comprising a bias-changing or "swapping" circuit BIAS-SWP, a bias-scrambling circuit BIAS-SCR, a generating circuit B-S-GEN, a first plurality and a second plurality of bias-signal lines or paths B-Path1 and B-Path2, two sensing lines SL1 and SL2, and a control circuit CONTR-CIRC for the first and second pluralities of lines B-Path1 and B-Path2. The swapping circuit BIAS-SWP is such as to provide an output signal which can adopt two possible voltage levels, that is, a low level and a high level, in dependence on the signals present on the selection lines Up-L, Up-R, Dw-L, Dw-R which are activated for access to a particular memory cell Qji. This swapping circuit BIAS-SWP comprises a first switch or pass-gate PG1 having, as an input signal, the signal of the line Dw-R and, as a control signal, the signal of the line Up-R.

In particular, the pass-gate PG1 may be formed in conventional manner, for example, by CMOS technology, and comprises an inverter INV1 for the control of a switch element SW1. For example, the switch element SW1 includes a pair of n-type and p-type MOS transistors (not shown) which are connected in parallel in accordance with methods known in the art. In accordance with the symbols used FIG. 6, the output of the inverter INV1 of the pass-gate PG1 is connected to a gate terminal of an n-type transistor of the switch element SW1 and the input line Up-R is connected directly to a gate terminal of a p-type transistor. The pass-gate PG1 is thus closed (that is, the signal Dw-R is transmitted as an output) when the signal Up-R is of low level, and is open (that is, the signal Dw-R is not transmitted as an output) when the signal Up-R is of high level.

The swapping circuit BIAS-SWP also comprises a second pass-gate PG2 having an inverter INV2 and a switch element SW2. The second pass-gate PG2 is similar to the first pass-gate PG1 and is closed (open) when the control signal Up-L is of low (high) level. It will be noted that, when the particular memory system 1000 described above is in operation, the signals Up-L and Up-R do not simultaneously adopt the same value. The first and the second pass-gates PG1 and PG2 have respective outputs which are short-circuited to one another and are connected to two inputs 21 and 22 of the bias-scrambling circuit BIAS-SCR.

This bias-scrambling circuit BIAS-SCR supplies, on respective output lines 23 and 24, two voltage signals of opposite levels in accordance with a configuration, on these output lines, which depends on the parity signals Ev or Od and on the signal received on the input lines 21 and 22. The scrambling circuit BIAS-SCR comprises a pass-gate PG3 including a switch element SW3 and an inverter INV3. The pass-gate PG3 receives, as an input, the signal which is present on the line 22 and has the parity signal Ev as a control signal. The pass-gate PG3 may be formed in similar manner to the pass-gate PG1 but, unlike the latter, is closed (open) when the control signal Ev is of high (low) logic level. The bias-scrambler circuit BIAS-SCR also comprises an inverting switch INV controlled by the parity signal Ev.

In the example given, the switch INV acts as an open switch for signals Ev of high logic level and acts as an inverting gate for signals Ev of low logic level. For example, the inverting switch INV can be formed in a manner clear to a person skilled in the art, by a conventional inverter comprising a pair of complementary MOS transistors (not shown) having their gate terminals connected to one another. Each of these transistors is connected in series with a respective activation transistor (of homonymous type) driven by the parity signal Ev. Moreover, the outputs of the inverting switch INV and of the pass-gate PG3 are short-circuited and are connected to the input of an inverter 25 to the output of which the output line 24 of the scrambling circuit BIAS-SCR is connected. The output of the inverter 25 is connected to an inverter 26 and then to the output line 23 of the scrambling circuit BIAS-SCR.

For a predetermined value of the signal present on the input lines 21 and 22 of the scrambling circuit BIAS-SCR, the switching of the signal Ev from one logic level to another causes switching of the logic level of the signal present on the lines 23 and 24, respectively. The generating circuit B-S-GEN has an output line L2 for making the sensing voltage V-BL available, and two output lines L1 and L3 for making the biasing voltage V-Bias or the ground voltage GND available, according to the signals present on the lines 23 and 24. The generating circuit B-S-GEN shown in FIG. 6 comprises a transistor C-M-T forming part of a conventional current mirror of the sense amplifier SA. The transistor C-M-T which, for example, is a p-type MOSFET having its gate connected to its own drain terminal, supplies the current for the reading or sensing of a generic cell.

In the embodiment of FIG. 6, electronic regulation means are connected to the terminal A and are formed, in the example, with a conventional limiter BL-LIM comprising an n-type transistor TR, the source and gate terminals ST and GT of which are connected for feedback by an inverter INV4. As is known, the limiter BL-LIM enables the voltage of the source terminal ST to be kept at a desired value via a feedback. This voltage of the source terminal ST is the voltage necessary for the reading of a generic cell and is thus the sensing voltage V-BL. The generating circuit B-S-GEN also comprises two regulation transistors R-T1 and R-T2 which are connected repetitively to the output lines 23 and 24 of the bias-scrambling circuit BIAS-SCR. These regulation transistors R-T1 and R-T2 enable the voltage V-Bias and the voltage GND to be configured alternatively and reversibly on the lines L1 and L3.

The regulation transistors R-T1 and R-T2 are preferably of dimensions such as to be substantially identical to the transistor TR connected to the line L2 for making available the sensing voltage V-BL. Moreover, the regulation transistors R-T1 and R-T2 have their gate terminals connected to the same gate terminal GT of the transistor TR. This enables the voltage applied to the gate terminals of the regulation transistors R-T1 and R-T2 to be regulated in the same manner in which the voltage applied to the terminal GT of the transistor TR varies.

If the characteristic dimensions of the regulation transistors R-T1 and R-T2 are selected in a manner such that they are substantially equal to those of the transistor TR, and if the gate terminals of these transistors are regulated as described above, it is possible to arrange for the biasing voltage V-Bias present on one of the lines L1, L3 to be substantially equal to the sensing voltage V-BL present on the line L2. For example, a situation is considered, in which a voltage of high logic level and of a value substantially equal to the supply voltage Vcc is present on the output line 23 of the bias-scrambling circuit BIAS-SCR. The regulation transistor R-T1 advantageously limits the voltage value transferred by the line 23 to the line L1 connected thereto (that is, the biasing voltage V-Bias) to a value substantially equal to the sensing voltage V-BL.

In the situation explained above, a low logic-level signal, that is, the voltage GND, is present on the output line 24 of the bias-scrambling circuit BIAS-SCR and is transmitted in full by the regulation transistor R-T2 on the line L3. In this configuration, the lines L2 and L3 will bias and read the selected cell whilst the line L1 will introduce the biasing voltage V-Bias necessary for isolation.

It is pointed out that the ability to derive the biasing voltage V-Bias from the reading circuit SA and from the sensing voltage V-BL in accordance with the above-described method is particularly advantageous because it ensures that the biasing voltage V-Bias is substantially equal to the sensing voltage V-BL. Nevertheless, it is pointed out that the voltage V-Bias may be generated by generating means independent of the reading circuit SA, that is, such as to generate the biasing voltage independently and without processing the sensing voltage produced by the reading circuit.

The generating circuit B-S-GEN preferably has an equalizer circuit comprising a line 43 provided with transistors 44 having gate terminals to which a control signal EQ can be applied. When the transistors 44 are activated for conduction, the line 43 enables the three output lines L1, L2 and L3 of the generating circuit 44 to be short-circuited so as to equalize the potentials of these lines before the reading of a memory cell. After this initialization, the short-circuit formed by the line 43 is opened, deactivating conduction of the transistors 44 to enable the memory cell to be read. Connected to the output line L2 are the two sensing lines SL1 and SL2, each of which is provided with a respective selection transistor TS1 or TS2 in which conduction can be activated/deactivated, respectively, by the parity signal Ev and by the parity signal Od, which are applied to the gate terminals of these transistors, respectively. The sensing lines SL1 and SL2 are connected to the even sensing line S-Ev and to the odd sensing line S-Od, respectively.

The selection transistors TS1 and TS2 enable the sensing voltage V-BL present on the line L2 to be supplied selectively to the even sensing line S-Ev and to the odd sensing line S-Od. The output line L1 (L2) of the generating circuit B-S-GEN is connected to the first (second) plurality of lines B-Path1 (B-Path2) comprising the lines 27 and 30 (32 and 33) which are connected, respectively, to the even sensing line S-Ev and to the odd sensing line S-Od, and the lines 28 and 29 (31 and 34), both of which are connected to the right-hand (left-hand) biasing line B-Rgt (B-Lft). The lines 27–30 (31–34) of the first (second) plurality B-Path1 (B-Path2) are provided, respectively, with selection transistors S1–S4 (S5–S8) in which conduction can be activated/deactivated by signals which are present on output lines 35–38 of the control circuit CONTR-CIRC and which are applied to their gate terminals.

By controlling the selection transistors S1–S8, the control circuit CONTR-CIRC enables the voltages present on the output lines L1, L3 of the generating circuit B-S-GEN to be distributed appropriately to the output lines B-Lft, B-Rgt, S-Ev, S-Od of the scrambler SCR. The control circuit CONTR-CIRC comprises a NAND gate 40 the input of which is connected to the lower left-hand selection line Dw-L and to the upper right-hand selection line Up-R. The output of the NAND gate 40 is connected, directly or via an inverter 42, to two NOR gates 41 which have two inputs and to which the parity signals Ev and Od are also applied. The control circuit CONTR-CIRC provides the signals for controlling the selection transistors S1–S8 on the basis of the signals present on the selection lines Dw-L and Up-R and of the parity signals Ev and Od, arranging for the correct biasing to be configured along the specific path in the region of the cell selected.

An example of the operation of the scrambler SCR will be described below. Reference is made to the table of FIG. 4 and, in particular, to the eighth line, indicated by an arrow. According to this line of the table of FIG. 4, the signals Up-R and Dw-R are of high logic level and the sensing voltage V-BL is to be made available on the bit line BL-3 (of odd parity), the ground voltage GND is to be made available on the bit line BL-2, the biasing voltage V-Bias (which, in particular, is equal to the sensing voltage V-BL) is to be made available on the bit line BL-4 (which lies to the right of the bit line BL-3), and the floating voltage is to be made available on the bit line BL-1.

According to this configuration, and with reference to FIG. 1, the cells disposed between the cell bit line BC-6 and the cell bit line BC-7, that is, the cells of the seventh column of the memory matrix 110, are read. In particular, the cell bit line BC-6 is to be brought to the ground voltage GND, and the cell bit line BC-7 has the role of the drain terminal to which the sensing voltage V-BL is applied. In this case, the parity signal Ev is of low logic level and the parity signal Od is of high logic level.

FIG. 6 shows the logic levels (1, 0) of the signals present at the inputs and the outputs of the circuits of the scrambler SCR in this particular example. In these conditions, the first pass-gate PG1 of the bias-swapping circuit BIAS-SWP is open, since the control input Up-R is of high logic level. The second pass-gate PG2 of the same circuit BIAS-SWP is closed, since the control input Up-L is of low logic level, and transmits the signal Dw-L (of low logic level) on the short-circuited lines 21 and 22. The low logic-level control signal Ev is applied to the third pass-gate PG3 included in the bias-scrambling circuit BIAS-SCR and this pass-gate PG3 is thus opened.

The inverting switch INV, which is controlled by the signal Ev, is closed so as to invert the logic level of the signal present on the line 21, supplying, at its own output, a high logic-level signal. This high logic-level signal is inverted by the inverter 25 and is then presented on the line 24. The signal output by the inverter 24 is also inverted by the inverter 26 and is then made available on the line 23 with a high logic level. A voltage signal of high logic level and equal to the supply voltage Vcc is thus present on the output line 23 of the bias-scrambling circuit BIAS-SCR and a signal of low logic level, equal to the ground voltage GND, is present on the line 24.

On the basis of these input signals which are present on the lines 23 and 24, and as described above, the generating circuit B-S-GEN will supply the biasing voltage V-Bias, which is substantially equal to the sensing voltage V-BL, on the output line L1, and the ground voltage GND on the output line L3. The sensing voltage V-BL derived from the sense amplifier SA is present on the output line L2. The inputs Dw-L and Up-R of low and high logic value, respectively, are applied to the NAND gate 40 of the control circuit CONTR-CIRC. At the output of the control circuit CONTR-CIRC, there is a high logic level signal on the output line 36 and, on the remaining lines 35, 37, 38, there are low logic-level signals.

In this situation, the selection transistors S6 and S2, which are circled in FIG. 6, are activated for conduction. Thus, the biasing voltage V-Bias will be present on the right-hand biasing line B-Rgt and the ground voltage GND will be present on the even sensing line S-Ev. The high parity signal Od activates the selection transistor TS1 (circled in FIG. 6)

for conduction, thus causing the sensing voltage V-BL to be available on the odd sensing line S-Od. Since the left-hand biasing line B-Lft is not connected to any of the output lines of the generating circuit B-S-GEN, it is at the floating voltage V-Floating. The reading voltages V-BL, GND and the biasing voltage V-Bias, which are distributed appropriately on the output lines of the scrambler SCR, are thus supplied by the multiplexers MUX-M0, MUX-N0 to the bit lines BL-1, BL-2, BL-3, BL-4, biasing the region surrounding the selected cell in accordance with the table of FIG. 4.

Naturally, to satisfy contingent and specific requirements, a person skilled in the art may apply to the above-described memory system many modifications and variations, all of which, however, are included with the scope of protection of the invention as defined by the appended claims.

That which is claimed is:

1. A column multiplexer for a memory matrix comprising memory cells arranged in rows and columns, the column multiplexer comprising:
   input lines for input signals;
   a plurality of output lines for electrical connection to the columns of the matrix; and
   selective connection means for selecting, in a first operation mode, a first group of output lines from among said plurality of output lines to selectively connect the first group of output lines to the input lines, the first group of output lines comprising at least three first output lines.

2. The column multiplexer according to claim 1, wherein the first group comprises four output lines.

3. The column multiplexer according to claim 2, wherein the four lines of said first group are contiguous.

4. The column multiplexer according to claim 1, further comprising a plurality of control lines for supplying control signals to the selective connection means, each of said control signals being able to activate/deactivate the corresponding control line in such a way as to control the selection of said first group of output lines.

5. The column multiplexer according to claim 4, wherein said selective connection means selects three output lines, activating a single control line at substantially the same time.

6. The column multiplexer according to claim 5, wherein a first control line is activated in the first operation mode and a second control line is activated in a second operation mode, so as to select a second group of output lines comprising at least three second output lines.

7. The column multiplexer according to claim 6, wherein said first and second control lines are contiguous and said second group of output lines is shifted by two bit lines contiguous to each other compared to the first group of output lines.

8. The column multiplexer according to claim 1, wherein at least three voltages for the at least three first output lines are supplied to said input lines.

9. The column multiplexer according to claim 1, wherein said selective connection means comprises:
   a plurality of selection lines connected to the input lines and to the plurality of output lines; and
   a plurality of selection transistors associated with said plurality of selection lines to activate/deactivate the plurality of selection lines.

10. The column multiplexer according to claim 9, further comprising a plurality of control lines for supplying control signals to the selective connection means, each of said control signals being able to activate/deactivate the corresponding control line in such a way as to control the selection of said first group of output lines, wherein the plurality of control lines is connected to said plurality of selection transistors to supply the control signals to activate/deactivate the selection transistors.

11. The column multiplexer according to claim 10, wherein each control line is connected to at least two selection transistors.

12. The column multiplexer according to claim 9, wherein a single selection transistor is associated to each selection line.

13. The column multiplexer according to claim 9, wherein each output line is connected to a first selection line and to a second selection line of the plurality of selection lines.

14. A column multiplexer for a memory matrix comprising memory cells arranged in rows and columns, the column multiplexer comprising:
   input lines for input signals;
   a plurality of output lines for connection to the columns of the matrix; and
   a selective connection unit to select a first group of output lines from the plurality of output lines to selectively connect the first group of output lines to the input lines, the first group of output lines comprising at least three first output lines.

15. The column multiplexer according to claim 14, wherein the first group comprises four output lines.

16. The column multiplexer according to claim 15, wherein the four lines of said first group are contiguous.

17. The column multiplexer according to claim 16, further comprising a plurality of control lines for supplying control signals to the selective connection unit to activate/deactivate the corresponding control line to control the selection of said first group of output lines.

18. The column multiplexer according to claim 16, wherein said selective connection unit comprises:
   a plurality of selection lines connected to the input lines and to the plurality of output lines; and
   a plurality of selection transistors associated with said plurality of selection lines to activate/deactivate the plurality of selection lines.

19. The column multiplexer according to claim 18, further comprising a plurality of control lines for supplying control signals to the selective connection unit, each of said control signals being able to activate/deactivate the corresponding control line to control the selection of said first group of output lines, wherein the plurality of control lines is connected to said plurality of selection transistors to supply the control signals to activate/deactivate the selection transistors.

20. The column multiplexer according to claim 19, wherein each control line is connected to at least two selection transistors.

21. The column multiplexer according to claim 18, wherein a single selection transistor is associated to each selection line.

22. The column multiplexer according to claim 18, wherein each output line is connected to a first selection line and to a second selection line of the plurality of selection lines.

23. A column selection system for a memory matrix comprising memory cells arranged in rows and columns, said system comprising:
   a column decoder having a plurality of inputs for corresponding column address signals and a plurality of outputs to supply control signals obtained from decoding the address signals; and a column multiplexer for selecting at least one column of said matrix and comprising a plurality of control lines to receive the control signals, said multiplexer further including input lines for input signals, a plurality of output lines for connection to the columns of the matrix, and a selective connection unit to select a first group of output lines from the plurality of output lines to selectively connect the first group of output lines to the input lines, the first group of output lines comprising at least three first output lines.

24. The column selection system according to claim 22, wherein the first group comprises four output lines.

25. The column selection system according to claim 23, wherein the four lines of said first group are contiguous.

26. The column selection system according to claim 22, wherein the plurality of control lines supply control signals to the selective connection unit to activate/deactivate the corresponding control line to control the selection of said first group of output lines.

27. The column selection system according to claim 22, wherein said selective connection unit comprises:

a plurality of selection lines connected to the input lines and to the plurality of output lines; and a plurality of selection transistors associated with said plurality of selection lines to activate/deactivate the plurality of selection lines.

28. The column selection system according to claim 27, wherein the plurality of control lines supply control signals to the selective connection unit to activate/deactivate the corresponding control line to control the selection of said first group of output lines, wherein the plurality of control lines is connected to said plurality of selection transistors to supply the control signals to activate/deactivate the selection transistors.

29. The column selection system according to claim 28, wherein each control line is connected to at least two selection transistors.

30. The column selection system according to claim 27, wherein a single selection transistor is associated to each selection line.

31. The column selection system according to claim 27, wherein each output line is connected to a first selection line and to a second selection line of the plurality of selection lines.

32. The column selection system according to claim 23, wherein said column decoder comprises an incomplete decode type column decoder.

33. The column selection system according to claim 32, wherein said column decoder (YN) is transparent with respect to at least one input of said plurality of inputs.

34. A circuit integrated into a semiconductor structure comprising:

a memory matrix comprising memory cells arranged in rows and columns; and a column multiplexer for the memory matrix and comprising input lines for input signals, a plurality of output lines for connection to the columns of the matrix, and a selective connection unit to select a first group of output lines from the plurality of output lines to selectively connect the first group of output lines to the input lines, the first group of output lines comprising at least three first output lines.

35. The integrated circuit according to claim 34, wherein said selective connection unit comprises:

a plurality of selection lines connected to the input lines and to the plurality of output lines, and a plurality of selection transistors associated to said plurality of selection lines to activate/deactivate the plurality of selection lines.

36. The integrated circuit according to claim 35, wherein said plurality of selection transistors comprises a plurality of MOSFETs including a group of MOSFETs having respective gate terminals with polysilicon layers partially in contact with each other.

37. The integrated circuit according to claim 36, further comprising at least one semiconductor layer having a portion to operate as an output terminal common to a group of said selection transistors.

38. The integrated circuit according to claim 34, further comprising:

an additional column multiplexer; and first metal lines connecting said column multiplexer to the additional column multiplexer.

39. The integrated circuit according to claim 38, further comprising second metal lines to contact drain and source terminals of said selection transistors, said first metal lines and second metal lines being formed on two layers of metallization.

* * * * *

UNITED STATES PATENT AND TRADEMARK OFFICE
CERTIFICATE OF CORRECTION

PATENT NO.    : 6,552,952 B2
DATED         : April 22, 2003
INVENTOR(S)   : Luigi Pascucci It is certified that error appears in the above-identified patent and that said Letters Patent is hereby corrected as shown below:

<u>Column 2,</u>
Line 14, delete "invention." insert -- invention --
Line 37, delete "virtual-ground" insert -- virtual ground --

<u>Column 3,</u>
Line 3, delete "by.a" insert -- by a --
Line 23, delete "-BC" insert -- BC --

<u>Column 5,</u>
Line 63, delete "or-biasing" insert -- or biasing --

<u>Column 6,</u>
Line 52, delete "suitable-distribution" insert -- suitable distribution --
Line 56, delete "to-activate" insert -- to activate --

<u>Column 9,</u>
Line 39, delete "the-scrambler" insert -- the scrambler --

<u>Column 10,</u>
Line 21, delete "input,code" insert -- input code --
Lines 66-67, delete "thus-represent" insert -- thus represent --

<u>Column 11,</u>
Line 61, delete "Ta-I" insert -- Ta-1 --

<u>Column 13,</u>
Line 44, delete "particularly," insert -- particularly --

<u>Column 20,</u>
Lines 30 and 35, delete "16" insert -- 14 --

UNITED STATES PATENT AND TRADEMARK OFFICE
CERTIFICATE OF CORRECTION

PATENT NO. : 6,552,952 B2
DATED : April 22, 2003
INVENTOR(S) : Luigi Pascucci

It is certified that error appears in the above-identified patent and that said Letters Patent is hereby corrected as shown below:

Column 21,
Line 13, delete "22" insert -- 23 --
Line 15, delete "23" insert -- 24 --
Lines 17 and 22, "22" insert -- 23 --

Signed and Sealed this

Sixteenth Day of September, 2003

JAMES E. ROGAN
*Director of the United States Patent and Trademark Office*